(12) United States Patent
Krauss et al.

(10) Patent No.: US 11,414,319 B2
(45) Date of Patent: Aug. 16, 2022

(54) METHOD FOR PRODUCING A NANOCRYSTALLINE, GAS-SENSITIVE LAYER STRUCTURE

(71) Applicant: Robert Bosch GmbH, Stuttgart (DE)

(72) Inventors: Andreas Krauss, Tuebingen (DE); Elisabeth Preiss, Rapperswil (CH)

(73) Assignee: Robert Bosch GmbH, Stuttgart (DE)

( * ) Notice: Subject to any disclaimer, the term of this patent is extended or adjusted under 35 U.S.C. 154(b) by 416 days.

(21) Appl. No.: 16/613,939

(22) PCT Filed: May 8, 2018

(86) PCT No.: PCT/EP2018/061851
§ 371 (c)(1),
(2) Date: Nov. 15, 2019

(87) PCT Pub. No.: WO2018/210628
PCT Pub. Date: Nov. 22, 2018

(65) Prior Publication Data
US 2021/0363004 A1 Nov. 25, 2021

(30) Foreign Application Priority Data
May 18, 2017 (DE) .......................... 102017208418.9

(51) Int. Cl.
*B81C 1/00* (2006.01)
*G01N 27/12* (2006.01)
(52) U.S. Cl.
CPC ....... *B81C 1/00206* (2013.01); *G01N 27/127* (2013.01); *B81C 2201/0173* (2013.01)

(58) Field of Classification Search
CPC ................... B81C 1/00206; B81C 2201/0181
See application file for complete search history.

(56) References Cited

U.S. PATENT DOCUMENTS

| 5,657,189 A | 8/1997 | Sandhu |
| 5,980,833 A * | 11/1999 | Higaki ................... G01N 27/12 |
| | | 436/153 |
| 2012/0251400 A1 * | 10/2012 | Kunieda ............ B01D 53/9418 |
| | | 502/67 |

(Continued)

FOREIGN PATENT DOCUMENTS

| CN | 101329357 A | 12/2008 |
| DE | 4334410 A1 | 4/1995 |

(Continued)

OTHER PUBLICATIONS

International Search Report for PCT/EP2018/061851, dated Jul. 4, 2018.

(Continued)

*Primary Examiner* — Moazzam Hossain
(74) *Attorney, Agent, or Firm* — Norton Rose Fulbright US LLP; Gerard Messina

(57) ABSTRACT

A method for producing a nanocrystalline, gas-sensitive layer structure. The method for producing a nanocrystalline, gas-sensitive layer structure on a substrate comprises the steps: depositing a base layer made of a base material; depositing a doping layer made of a doping material; repeating the preceding steps; and performing a tempering step, whereby a gas-sensitive, nanocrystalline layer structure is produced.

11 Claims, 2 Drawing Sheets

(56) References Cited

U.S. PATENT DOCUMENTS

2012/0313055 A1* 12/2012 Yukinobu ............ C23C 18/1216
427/532
2019/0317036 A1* 10/2019 Sankarraj .............. C23C 14/087

FOREIGN PATENT DOCUMENTS

| EP | 0079437 | A2 | 5/1983 |
|---|---|---|---|
| JP | 2000055852 | A | 2/2000 |
| JP | 2007064909 | A | 3/2007 |

OTHER PUBLICATIONS

Sandipan Ray et al., "Electrical and Optical Properties of Sol-Gel Prepared Pd-Doped SnO 2 Thin Films: Effect of Multiple Layers and Its Use as Room Temperature Methane Gas Sensor", Journal of Ovonic Research, 2010, pp. 63-74, XP055487576.

Preiss Elisabeth M et al., "Tin Oxide-Based Thin Films Prepared by Pulsed Laser Deposition for Gas Sensing", Sensors and Actuators B: Chemical: International Journal Devoted to Research and Development of Physical and Chemical Transducers, Elsevier BV, NL, BD. 236, 2016, pp. 865-873, XP029700010.

Walter J. Dressick et al., "Preparation and Layer-By-Layer Solution Deposition of Cu(In,Ga) 02 Nanoparticles With Conversion to Cu(In,Ga)S2 Films", PLOS ONE, BD. 9, NR . 6, 2014, E100203, XP055487371.

Korotcenkov G. et al., "Successive Ionic Layer Deposition (Sild) as a New Sensor Technology: Synthesis and Modification of Metal Oxides", Measurement Science and Technology, IOP, Bristol, GB, BD. 17. NR. 7, 2006, pp. 1861-1869, XP020103603.

Adams D.P.: "Reactive multilayers fabricated by vapor deposition: A critical review", Thin Solid Firns, 576 (2015), pp. 98-128.

Marin et al.: "Multilayer Al2O3 Atomic Layer Deposition coatings for the corrosion protection of stainless steel", Thin Solid Films, 522 (2012), pp. 283-288.

Mehraj, et al.: Annealing dependent oxygen vacancies in SnO2 nanoparticles: Structural, electrical and their ferromagnetic behavior, Materials Chemistry and Physics, 171 (2016), pp. 109-118.

Yang, et al.: "Development on stability study of metal oxide gas sensor", Transducer and Microsystem Technologies 26(2), (2007), pp. 1-3, 7, with English abstract.

Zheng, et al.: "Review of Multilayer Thin Film Gas Sensor", Journal of Functional Materials 29(5), (1998), pp. 458-461, with English abstract.

* cited by examiner

METHOD FOR PRODUCING A NANOCRYSTALLINE, GAS-SENSITIVE LAYER STRUCTURE

FIELD

The present invention relates to a method for producing a nanocrystalline, gas-sensitive layer structure.

BACKGROUND INFORMATION

Although any micromechanical components are applicable, the present invention and its underlying problem are explained with reference to components having gas sensors.

The sensitive layers of metal oxide gas sensors are normally made up of a homogeneous material, a material being applied as a paste and sintered on the sensor according to the related art. There are also methods for depositing inks (InkJet) and thin-film processes (CVD/PVD, chemical and physical vapor deposition) are also used for the deposition, e.g., by sputtering or pulsed laser (re)deposition. Within thin-film technology in turn, very many methods are used for producing layers and layer systems having defined, e.g. optical, electrical, gas-sensitive, reactive and/or magnetic properties, e.g., European Patent Application No. EP 0 079 437 A2, Japan Patent No. JP 2000 055 852 A, U.S. Pat. No. 5,657,189 A, D. P. Adams, Thin Solid Films, 576, 2 Feb. 2015, 98-128. It is decisive that the layer systems are essentially unchangeable, that in particular the layers essentially do not mix following application.

Beginning some years ago, layers have been applied by thin-film methods such as, e.g., atomic layer deposition, which are applied in a very tight sequence, usually only a few nanometers thick, and which have in particular properties protecting against corrosion, as described in, e.g., E. Marin et al, Thin Solid Films, 522, 1 Nov. 2012, 283-288. Layers applied in thin-film application are relatively new for gas sensors, which are subjected to a tempering step following application. Here is was possible in the case of a two-ply system including a ply of a base material ($SnO_2$, stannic oxide) and a ply of a doping material (Pd, palladium) to demonstrate a complete homogeneous diffusion of Pd into the $SnO_2$ layer. Simultaneously with the distribution of Pd, most likely occurring through processes of diffusion, there occurs also a recrystallization of the previously applied, already partially crystalline, $SnO_2$, which should support the homogeneous distribution: (E. M. Preiß et al, Sensors and Actuators B: Chemical, 236, 29 Nov. 2016, 865-873). The homogeneous layer thicknesses achievable with a two-ply initial structure of this kind are limited, especially because not all materials have good diffusion properties. Moreover, the parameter selection in tempering steps (time, temperature) is limited because some sensor materials may have undesired recrystallization properties. Furthermore, under some conditions, tempering also influences, in undesirable fashion, the surface chemistry and thus also the gas-sensitive properties, see, e.g., Mehraj et al, Materials Chemistry and Physics, 171, 1 Mar. 2016, 109-118. Deposition of mixtures e.g. via simultaneous sputtering from several targets or from mixed targets is indeed possible, but normally separate sputtering is more cost-effective and less laborious.

Additional examples for methods for producing gas-sensitive layer structures are described in the following publications: Sandipan Ray et al: "ELECTRICAL AND OPTICAL PROPERTIES OF SOL-GEL PREPARED Pd-DOPED SnO2 THIN FILMS: EFFECT OF MULTIPLE LAYERS AND ITS USE AS ROOM TEMPERATURE METHANE GAS SENSOR" (Journal of Ovonic Research, Feb. 2, 2010 (2010 Feb. 2), pages 63-74, XP055487576), Korotcenkov G. et al: "Successive ionic layer deposition (SILD) as a new sensor technology: synthesis and modification of metal oxides" (MEASUREMENT SCIENCE AND TECHNOLOGY, IOP, Bristol, GB, vol. 17, no. 7, Jul. 1, 2006 (2006 Jul. 1), pages 1861-1869, XP020103603) and Preiss Elisabeth M. et al: "Tin oxide-based thin films prepared by pulsed laser deposition for gas sensing" (SENSORS AND ACTUATORS B: CHEMICAL, ELSEVIER BV, NL, vol. 236, Feb. 23, 2016 (2016 Feb. 23), pages 865-873, XP029700010).

SUMMARY

The present invention provides a method for producing a gas-sensitive layer structure.

Preferred developments of the present invention are described herein.

The present invention provides an example method for producing a gas-sensitive layer structure, in which it is possible to set, independently of each other, a target variable for a recrystallization of the base material and a doping concentration. Thin-film methods may respectively be used for the layer deposition, which form only simple, non-gas-reactive, amorphous or partially amorphous films (instead of complex methods that deposit already gas-sensitive layers). As another advantage, due to the normally tight layer sequence, it is possible to use doping materials that diffuse rather poorly.

The essence of the production method according to the present invention is the alternating and multi-ply deposition of at least one base material and at least one doping material with a subsequent tempering step for producing a sensitive layer structure for gas sensors. In terms of material and layer thickness, the doping material is selected in such a way that in the tempering step it enters into the base material by diffusion and subsequently disperses in the base material almost completely. At the same time, the layer sequence and the ply thickness of the doping material is selected in such a way that the doping material provides limits for the recrystallization of the base material in the tempering step. The boundary conditions for the tempering step are accordingly chosen so as to result in a dispersion of the doping material and a recrystallization of the sensitive material. Thin-film-based materials for gas sensors are thereby on the one hand homogeneously doped and, on the other hand, the structural properties are set in a defined manner.

According to a preferred development of the method of the present invention, the base material comprises one or multiple semiconductive oxide materials and/or one or multiple metals. This makes it possible to set the gas-sensitive properties of the layer structure in optimized fashion.

According to one preferred development of the method of the present invention, the base material is selected from a group of semiconductive oxidic materials, in particular made up of $SnO_2$ (stannic oxide), ZnO (zinc oxide), CuO (cupric oxide), $In_2O_3$ (indium oxide), $WO_3$ (tungsten trioxide), indium tin oxide, as well as their metallic pure substance e.g. Sn (tin), or copper (Cu), and/or mixtures thereof.

According to another preferred development of the method of the present invention, the doping material comprises one or multiple metals, the metals being selected from a group made up of noble metals, Au (gold), Pd (palladium), Pt (platinum), Cu (copper), Rh (rhodium), Re (rhenium), and/or mixtures thereof. This makes it possible to set the gas-sensitive properties of the layer structure in optimized fashion.

According to another preferred development of the method of the present invention, the base material is already doped prior to or during the deposition of the individual layer using a homogeneous basic doping, the material for the basic doping comprising one or multiple metals. This makes it possible to introduce additional doping materials (which exhibit, e.g., a poor diffusion behavior in the tempering step) into the later sensor material.

A pure metallic stack is also possible, having multiple alternating layers of metals (for example Sn as base material and Pd as doping material), which is deposited and partially or completely oxidized in the tempering step, whereby multiple separated plies form for example of $SnO_2$, which is doped with Pd.

According to another preferred development of the method of the present invention, the doping material comprises carbon and/or organic material such as for example lacquers commonly used in photolithography.

It is possible to implement the doping material for example as a binary material mixture in such a way that a portion of the doping layer combusts in the annealing process. Nevertheless, the doping material is still able to act as a barrier for the recrystallization of the base material. The doping material may concretely be a noble metal that is sputtered in carbonaceous gas, a doping layer made of metal and carbon depositing in the process, the carbon component of which is essentially combusted in the annealing step.

Additional plies between the base material and the doping material may also be formed by an essentially completely combusting layer of for example carbon or organic materials as for example lacquers commonly used in photolithography. Subsequently, the layer structure may be formed by a tempering step (annealing step).

According to another preferred development of the method of the present invention, the base material and/or the doping material additionally comprises one or multiple electrically non-conductive oxides of the alkali metals or alkaline-earth metals or of the rare earths in proportions of less than 10%. These may be selected from a group comprising oxides of alkali metals or alkaline earth metals, oxides of rare earths such as CeO (ceric oxide) and/or mixtures thereof. The sensor properties of the layer structure may be improved thereby and a structural and electrical stabilization of the later sensor material may be achieved in air and at temperatures of typically up to approximately 350° C.

According to another preferred development of the method of the present invention, the deposition of the doping layer of doping material occurs in a carbonaceous gas atmosphere. This allows for a doping layer made of metal and carbon to be deposited, whose carbon component is essentially combusted in the annealing step. This also makes it possible to introduce small concentrations of the doping material after the annealing step, while the geometry of the later sensor material is essentially unchanged. The material mixture may be deposited in a sufficiently great layer thickness as a homogeneous layer, and the carbon component combusts in the annealing step. If one were to deposit a comparable quantity of doping material as what would then be a very much thinner layer of only one pure material, no closed, homogeneous layer would form in some deposition methods. An analogous method may also be applied for the base layer made of base material.

According to another preferred development of the method of the present invention, the layer thickness of the base layer is made up of base material prior to the tempering step between 10 and 200 nm and/or the layer thickness of the doping layer made up of doping material is between 5 and 10 nm. This depends on material and method, in sputtering or in ALD processes, these are normally several nm in the case of metals. Thus it is possible to control the layer thickness in optimized fashion.

According to another preferred development of the method of the present invention, the tempering step (annealing step) is performed at a temperature of 350-850° C. This makes it possible to control diffusion processes as desired.

BRIEF DESCRIPTION OF THE DRAWINGS

The present invention is explained in more detail below with reference to the exemplary embodiments shown in the schematic figures.

DETAILED DESCRIPTION OF EXAMPLE EMBODIMENTS

In the figures, identical reference symbols denote identical or functionally equivalent elements.

Figure 1:
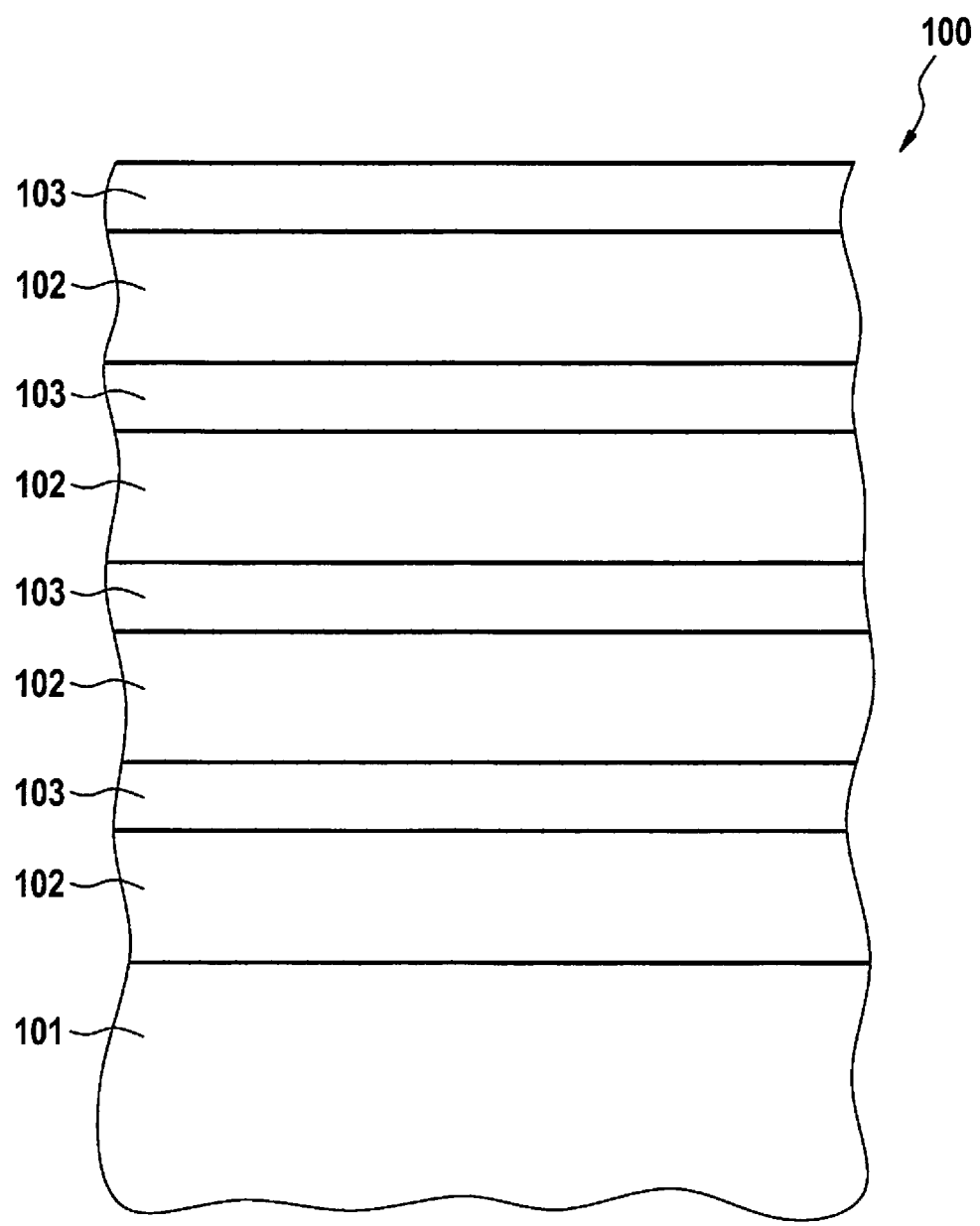
FIG. 1 shows a schematic representation for explaining a layer structure according to a specific embodiment of the present invention prior to the tempering step, in a cross sectional view.

FIG. 1 is a schematic representation for explaining a layer structure according to a specific embodiment of the present invention prior to the tempering step, in a cross-sectional view.

FIG. 1 shows the case of an amorphous deposition of base material and doping material; while other morphologies are also possible, for example a base material that is already present after the deposition in partially crystalline form, the doping material already being able to penetrate along the grain boundaries during the deposition, but above all during the annealing step.

In FIG. 1, reference numeral 101 indicates an insulating layer (substrate), 102 indicates the base layers made of base material, 103 indicates a doping layer made of doping material and 100 indicates the entire layer structure following the deposition for example by sputtering or ALD processes prior to the tempering step (annealing step).

The substrate (insulating layer) is not bounded further and may be made up of an electrically non-conductive material such as oxide or nitride of silicon (Si) or other materials such as e.g. sapphire or aluminum oxide and/or mixtures, it also being possible for electrodes to be mounted on the substrate for contacting the sensor layer made of metals, e.g. platinum (Pt).

The precise composition may be chosen as a function of method and use.

It is also possible, however, for base layers 102 to be made of pure metallic material, and doping layers 103 could also be made up of 2 or more layers, e.g. doping material ply and additional separating ply.

Figure 2:
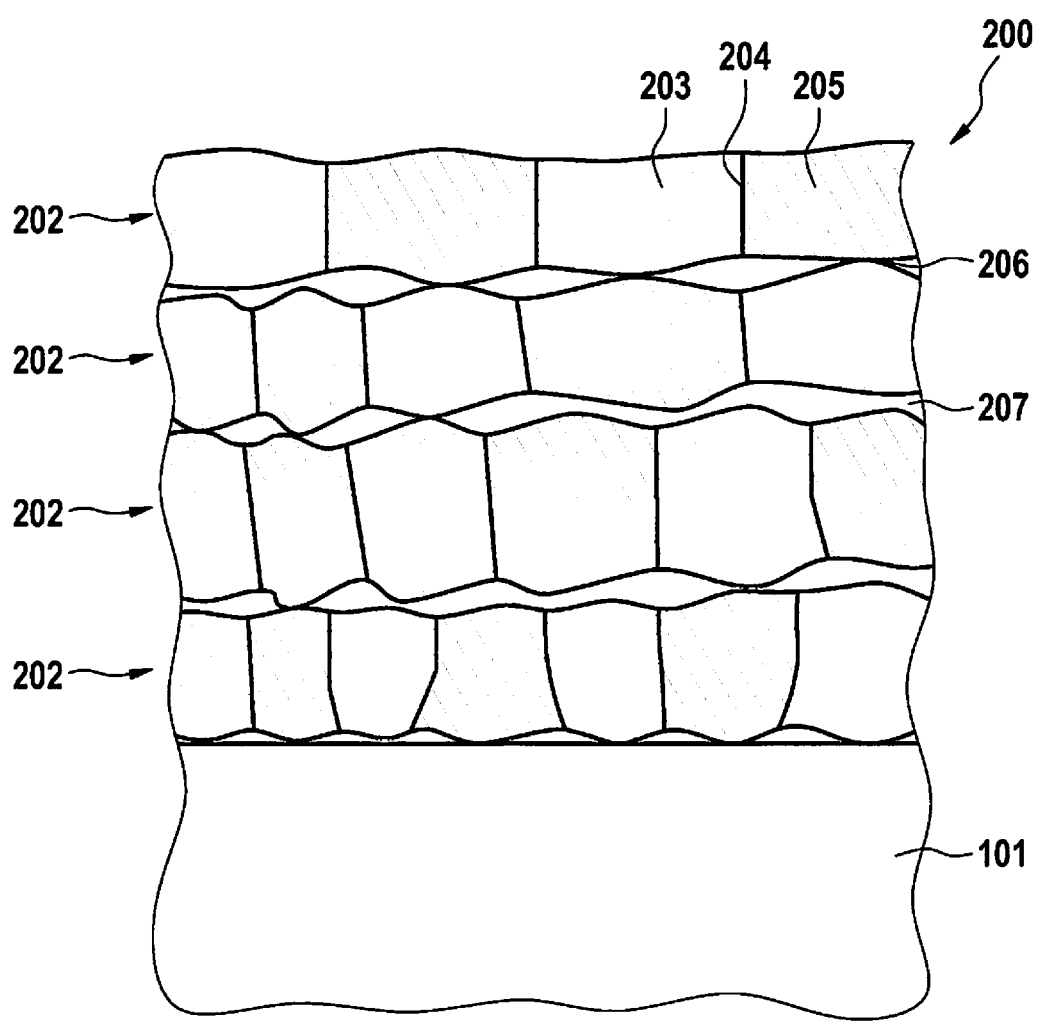
FIG. 2 shows a schematic representation for explaining the layer structure according to the specific embodiment of the present invention after the tempering step, in a cross sectional view.

FIG. 2 is a schematic cross-sectional representation for explaining the layer structure according to the specific embodiment of the present invention following the tempering step.

In FIG. 2, reference numeral 202 indicates the layers of the crystalline or partially crystalline material, 203 and 205 indicate in exemplary fashion areas of differing crystallinity, 204 indicates an exemplary grain boundary within a layer 202, and 206 and, respectively, 207 indicate separating areas in the lateral direction, and 200 indicates the entire layer structure following the tempering step (annealing step).

In FIG. 2, the base layers 102 from FIG. 1 now exist as layers 202 of a crystalline or partially crystalline material, the hatching schematically indicating areas of different crystal orientation or different crystallinity, for example 203 and 205, within the individual layers. These areas are connected via boundary surfaces "grain boundaries" 204 within the layers. The layers are for the most part clearly separated from one another, the separating areas in the lateral direction being located in places in which doping layers 103 of the doping material were still present prior to the annealing step 103, for example at 207. On the other hand, in many places the layers are also connected via boundary surfaces to areas of other layers, as indicated by 206 for example. At least in the vertical direction, the sizes of the particles are clearly limited to the layer thickness prior to the tempering step (annealing step). The doping material essentially no longer exists as an independent, separate material layer, but is diffused into the base material. It is located either in material 203, 205 and/or on the grain boundaries 206, 204 and/or on the surfaces of the material. The doping material should also still be found at least in traces on the former boundary surfaces on and between base layers 102.

The annealing step occurs in an oxygen-containing gas mixture of 1-30 vol. % O2, one possibility here being air. For accelerating the annealing process and increasing the mobility of the doping material, a component of moisture (water) of absolute 1-15 vol. % is present in the gas mixture. The temperature of the annealing step may be between approximately 400° C. and 800° C., for example. Limiting factors for the temperature are as follows: Downward, a minimum temperature is required for starting rebuilding reactions and recrystallization in the base material, typically approximately 350-400° C. This minimum temperature is typically also selected in such a way that it is above the later operating temperature of the sensor. A suitable gas atmosphere, for example components of moisture or nitrogen oxide, may be helpful in the rebuilding and lower the temperature. In the upward direction, the stability of the substrate limits the temperature in the annealing step. In addition to the mechanical support function, the substrate is also able to take on the function of contacting the gas-sensitive layer structure via an electrode system. This would be made up for example of compact layers, approximately 200 nm thick, of noble metal such as Pt or PtRh (platinum, rhodium) on the substrate (insulating layer) with intervals of typically 10 μm to 200 μm. In between is the layer from the figures and runs either on or over these electrode areas, or the electrodes are deposited in structured fashion onto the sensor material after the latter has been applied.

The material resulting from the tempering step in the form presented here is prototypical for a gas sensor material. It is (partially) crystalline and thereby structurally stable even in operation in different gases. On the other hand, the provided method makes it possible to choose and set the particle sizes in such a way that the particles markedly change their electrical resistance through surface reactions, individually and thus also in sum. As a third positive property, the plies have at least some cavities, into which and through which gases are readily able to diffuse into the entire layer of the different plies, which produces a high and quick gas reaction. In addition, the doping material is distributed predominantly homogeneously on, at and in the layer structure across the entire layer thickness. In a typical sensor system, the material is supplied with current laterally via electrodes. That is, a current flows primarily horizontally and parallel to the substrate surface (in the figures from left to right) and only to a limited extent vertically (from top to bottom). For such a system, the structure achievable here should be ideally suitable since the many grain boundaries in the direction of current flow produce a high sensitivity to gases.

Using transmission electron microscope recordings, it is possible to produce layer structure sectional views following the tempering step (annealing step), e.g. die recrystallization of two thin layers (oxide material) with an additional layer (noble metal) that was originally deposited in between. The original multi-ply system and the recrystallization occurring independently in the two plies with limitation of the grain size to approximately half of the total thickness may be readily seen due to the boundary surfaces. By way of example, a layer system may be constructed as follows: A first partially crystalline layer (e.g., approximately 50 nm), and below and separated from it (partially with empty and therefore irradiated cavities) the second partially crystalline layer (approximately 40 nm). Below in turn is a substrate (insulating layer, e.g. approximately 15 nm) on a silicon substrate. If additionally e.g. an EDX line scan is performed on the layer structure in order to determine the element distribution, the distribution of the elements may be determined on the boundary surfaces (204, 206) and in the material 203 and 205.

Although the present invention has been described with the aid of preferred exemplary embodiments, it is not limited to these. The mentioned materials and topologies in particular have merely exemplary character and are not restricted to the explained examples.

What is claimed is:

1. A method for producing a nanocrystalline, gas-sensitive layer structure on a substrate, the method comprising the following steps:
   a) depositing a base layer made of a base material;
   b) depositing a doping layer made of a doping material;
   c) repeating the steps a) and/or b); and
   d) performing a tempering step in an oxygen-containing gas mixture including 1 vol. % to 30 vol. % $O_2$ and a component of moisture of absolute 1 vol. % to 15 vol. %, whereby the doping material is selected such that the doping material is diffused into the base material, subsequently disperses in the base material almost completely, provides limits for recrystallization of the base material, and the nanocrystalline, gas-sensitive layer structure is produced from a plurality of stacked, nanocrystalline layers comprising the base material and the diffused doping material, each of the nanocrystalline layers having areas of different crystal orientation being formed which are separated from one another respectively by a grain boundary within the respective nanocrystalline layer.

2. The method as recited in claim 1, wherein the base material includes one or multiple semiconductive oxide materials and/or one or multiple metals.

3. The method as recited in claim 2, wherein the base material is selected from a group of semiconductive oxidic materials, the group including $SnO_2$ (stannic oxide), ZnO (zinc oxide), CuO (cupric oxide), $In_2O_3$ (indium oxide), $WO_3$ (tungsten trioxide), indium tin oxide, respectively associated metals, and/or mixtures thereof.

4. The method as recited in claim 1, wherein the doping material includes one or multiple metals, the metals being selected from a group made up of noble metals, Au (gold), Pd (palladium), Pt (platinum), Cu (copper), Rh (rhodium), Re (rhenium), and/or mixtures thereof.

5. The method as recited in claim 1, wherein the base material is doped prior to deposition with a basic doping, the material for the basic doping comprising one or multiple metals.

6. The method as recited in claim 5, wherein the one or multiple metals including, Au (gold) and/or Pd (palladium) and/or Pt (platinum) and/or copper (Cu).

7. The method as recited in claim 1, wherein the doping material comprises carbon and/or organic compounds.

8. The method as recited in claim 1, wherein the base material and/or the doping material additionally comprises one or multiple electrically non-conductive materials, the electrically non-conductive materials including non-conductive oxides of the alkali metals and alkaline-earth metals or of the rare earths in proportions of less than 10%.

9. The method as recited in claim 1, wherein the deposition of the base layer (102) of base material and/or of the doping layer of doping material occurs in a carbonaceous gas atmosphere.

10. The method as recited in claim 1, wherein the layer thickness of the base layer made of base material prior to the tempering step is between 10 and 200 nm and/or the layer thickness of the doping layer made up of doping material prior to the tempering step is between 5 and 10 nm.

11. The method as recited in claim 1, wherein the tempering step is performed at a temperature of 350-850° C.

* * * * *